(12) United States Patent
Yagi et al.

(10) Patent No.: US 8,044,491 B2
(45) Date of Patent: Oct. 25, 2011

(54) SEMICONDUCTOR DEVICE AND METHOD OF MANUFACTURING THE SAME

(75) Inventors: Ryotaro Yagi, Kyoto (JP); Yuichi Nakao, Kyoto (JP); Isamu Nishimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/805,167

(22) Filed: Jul. 15, 2010

(65) Prior Publication Data

US 2010/0283125 A1 Nov. 11, 2010

Related U.S. Application Data

(63) Continuation of application No. 12/007,084, filed on Jan. 7, 2008, now Pat. No. 7,781,863.

(30) Foreign Application Priority Data

Jan. 9, 2007 (JP) ................................. 2007-001526

(51) Int. Cl.
*H01L 29/92* (2006.01)
(52) U.S. Cl. ................. 257/532; 257/535; 257/E29.343
(58) Field of Classification Search .................. 257/532, 257/535, E29.343
See application file for complete search history.

(56) References Cited

U.S. PATENT DOCUMENTS

| | | | |
|---|---|---|---|
| 5,670,808 A | 9/1997 | Nishihori et al. | |
| 5,929,473 A | 7/1999 | Nishihori et al. | |
| 6,680,521 B1 * | 1/2004 | Kar-Roy et al. | ............... 257/532 |
| 6,713,840 B1 | 3/2004 | Lee et al. | |
| 6,885,081 B2 | 4/2005 | Morimoto | |
| 7,282,404 B2 * | 10/2007 | Coolbaugh et al. | ........... 438/239 |
| 2003/0011043 A1 * | 1/2003 | Roberts | ......................... 257/532 |
| 2005/0064658 A1 | 3/2005 | Biery et al. | |
| 2006/0145293 A1 | 7/2006 | Cho | |

FOREIGN PATENT DOCUMENTS

JP 8-274256 10/1996

* cited by examiner

*Primary Examiner* — Victor A Mandala
*Assistant Examiner* — Scott Stowe
(74) *Attorney, Agent, or Firm* — Rabin & Berdo, P.C.

(57) ABSTRACT

The semiconductor device according to the present invention includes a lower electrode made of a metallic material, a capacitance film made of an insulating material and laminated on the lower electrode, an upper electrode made of a metallic material, opposed to the lower electrode through the capacitance film, and having an outline smaller than that of the lower electrode in plan view along the opposed direction, and a protective film made of the same material as that of the capacitance film and laminated on the upper electrode.

9 Claims, 3 Drawing Sheets

1

SEMICONDUCTOR DEVICE AND METHOD OF MANUFACTURING THE SAME

CROSS-REFERENCE TO RELATED APPLICATION

This application is a continuation of application Ser. No. 12/007,084, filed Jan. 7, 2008, hereby incorporated by reference.

BACKGROUND OF THE INVENTION

1. Field of the Invention

The present invention relates to a semiconductor device having a capacitance element of an MIM (metal-insulator-metal) structure and a method of manufacturing the same.

2. Description of Related Art

A capacitance element having a structure (MIM structure) obtained by sandwiching an insulating capacitance film between a lower electrode and an upper electrode has attracted attention as a capacitance element loaded on a system LSI for radio communication in particular, since the same has a small resistive component and can be increased in capacitance density.

While the lower electrode and the upper electrode of the capacitance element having the MIM structure are generally formed by metal films containing Al (aluminum), preparation of the lower electrode from Cu (copper) having higher conductivity than Al has been studied, in order to further reduce the resistance.

FIGS. 3(a) to 3(e) are schematic sectional views successively showing the steps of manufacturing a semiconductor device having a lower electrode made of Cu.

First, a semiconductor substrate having an interlayer insulating film 91 on the outermost surface is prepared. Then, a lower electrode 92 made of Cu is formed on the surface layer portion of the interlayer insulating film 91 by the damascene process. Thereafter a capacitance film 93 made of SiN (silicon nitride) and a metal film 94 made of TiN (titanium nitride) are laminated on the interlayer insulating film 91 in this order, as shown in FIG. 3(a).

Then, a resist pattern is formed on the metal film 94, which in turn is etched through this resist pattern as a mask. Thus, an upper electrode 95 is formed as shown in FIG. 3(b). After termination of this etching, the resist pattern is removed from the upper electrode 95 (metal film 94).

Thereafter another interlayer insulating film 96 is laminated on the capacitance film 93 and the upper electrode 95 to cover them, as shown in FIG. 3(c). Then, another resist pattern is formed on the interlayer insulating film 96, which in turn is etched through this resist pattern as a mask. Thus, through-holes 97 and 98 partially exposing the capacitance film 93 and the upper electrode 95 respectively are formed in the interlayer insulating film 96.

Then, the capacitance film 93 is etched through the interlayer insulating film 96 as a mask, whereby an opening 99 for contact with the lower electrode 92 is formed in the capacitance film 93, as shown in FIG. 3(d). At this time, not only the capacitance film 93 but also the portion of the upper electrode 95 exposed through the through-hole 98 is etched.

Thereafter a lower electrode contact plug 100 connected to the lower electrode 92 through the through-hole 97 and the opening 99 and an upper electrode contact plug 101 connected to the upper electrode 95 through the through-hole 98 are formed, whereby the semiconductor device having the structure shown in FIG. 3(e) is obtained.

In the step of forming the opening 99 in the capacitance film 93, however, the opening 99 may not be formed or the etching of the upper electrode 95 may excessively progress and the upper electrode 95 is pierced, depending on the relation between the thickness of the interlayer insulating film 96 and the time (etching time) of etching the capacitance film 93.

When the capacitance film 93 is dry-etched, for example, ions and radicals do not successfully reach the surface of the capacitance film 93 and the opening 99 is not formed in the capacitance film 93 if the thickness of the interlayer insulating film 96 is excessively large (not less than 1000 nm).

If the thickness of the capacitance film 93 is excessively small (not more than 900 nm), on the other hand, ions and radicals strongly collide with the portion of the upper electrode 95 exposed from the through-hole 98. When the etching time is set long, therefore, the upper electrode 95 is pierced, and in a worse case, the etching progresses up to the capacitance film 93. If the capacitance film 93 is etched, a pass causing capacitor leakage may be formed between the lower electrode 92 and the upper electrode 95 (upper electrode contact plug 101). When the etching time is set short, on the contrary, there is a possibility that the opening 99 cannot be formed in the capacitance film 93 and conduction between the lower electrode 92 and the lower electrode contact plug 100 cannot be attained.

SUMMARY OF THE INVENTION

An object of the present invention is to provide a semiconductor device and a method of manufacturing the same, which are capable of reliably forming an opening for contact with a lower electrode in a capacitance film without etching an upper electrode.

One aspect of the present invention may provide a semiconductor device including: a lower electrode made of a metallic material; a capacitance film made of an insulating material and laminated on the lower electrode; an upper electrode made of a metallic material, opposed to the lower electrode with the capacitance film sandwiched therebetween, and having an outline smaller than that of the lower electrode in plan view along the opposed direction; and a protective film made of the same material as that of the capacitance film and laminated on the upper electrode.

In this semiconductor device, the capacitance film is laminated on the lower electrode, and the upper electrode is opposed to the lower electrode with the capacitance film sandwiched therebetween. The protective film made of the same material as that of the capacitance film is laminated on the upper electrode.

When an insulating film such as an interlayer insulating film is formed on the capacitance film and the protective film, through-holes partially exposing the capacitance film and the protective film respectively are formed in the insulating film and then the capacitance film and the protective film are etched through the respective through-holes, thereby forming openings for contact with the lower electrode and the upper electrode in the capacitance film and the protective film respectively.

The capacitance film and the protective film are made of the same material, whereby the openings can be reliably formed in the capacitance film and the protective film respectively without etching the upper electrode, by forming the portion of the capacitance film to be provided with the opening thinner (smaller in thickness) than the portion of the protective film to be provided with the opening and setting the time for etching the capacitance film and the protective film to that necessary and sufficient for forming the opening in the protective film.

The protective film is laminated on the upper electrode, whereby the upper electrode can be prevented from being etched when the through-holes are formed in the insulating film.

Preferably, the protective film has the same outline as that of the upper electrode in plan view. Thus, the entire surface of the upper electrode can be covered with the protective film, and the upper electrode can be prevented from being etched on the entire surface thereof when the through-holes and the openings are formed.

Another aspect of the present invention may provide a semiconductor device including: a lower electrode made of a metallic material; a capacitance film made of an insulating material and laminated on the lower electrode; an upper electrode made of a metallic material, opposed to the lower electrode with the capacitance film sandwiched therebetween, and having an outline smaller than that of the lower electrode in plan view along the opposed direction; and a protective film made of an insulating material laminated on the upper electrode, and having the same outline as that of the upper electrode in plan view.

In this semiconductor device, the capacitance film is laminated on the lower electrode, and the upper electrode is opposed to the lower electrode with the capacitance film sandwiched therebetween. The protective film having the same outline as that of the upper electrode in plan view is laminated on the upper electrode. In other words, the entire surface of the upper electrode is covered with the protective film.

When an insulating film such as an interlayer insulating film is formed on the capacitance film and the protective film, through-holes partially exposing the capacitance film and the protective film respectively are formed in the insulating film and then the capacitance film and the protective film are etched through the respective through-holes, thereby forming openings for contact with the lower electrode and the upper electrode in the capacitance film and the protective film respectively.

The openings can be reliably formed in the capacitance film and the protective film respectively without etching the upper electrode, by determining the material of the protective film and the thickness of the portion of the capacitance film to be provided with the opening so that the opening is formed in the capacitance film before formation of the opening in the protective film and setting the time for etching the capacitance film and the protective film to that necessary and sufficient for forming the opening in the protective film.

The entire surface of the upper electrode is covered with the protective film, whereby the upper electrode can be prevented from being etched when the through-holes are formed in the insulating film.

Still another aspect of the present invention may provide a method of manufacturing a semiconductor device, including: a capacitance film forming step of forming a capacitance film made of an insulating material on a lower electrode made of a metallic material; an upper electrode forming step of forming an upper electrode made of a metallic material, having an outline smaller than that of the lower electrode in plan view along the opposed direction on a position of the capacitance film opposed to the lower electrode; a protective film forming step of forming a protective film made of an insulating material on the upper electrode; an insulating film forming step of forming an insulating film made of an insulating material on the capacitance film and the protective film; a through-hole forming step of forming through-holes partially exposing the capacitance film and the protective film respectively in the insulating film; and an etching step of etching the capacitance film and the protective film through the insulating film as a mask, thereby forming openings exposing the lower electrode and the upper electrode in the capacitance film and the protective film respectively after the through-hole forming step.

According to this manufacturing method, the capacitance film is first formed on the lower electrode. Then, the upper electrode is formed on the position of the capacitance film opposed to the lower electrode. Further, the protective film is formed on the upper electrode. Then, the insulating film made of an insulating material is formed on the capacitance film and the protective film, and the through-holes partially exposing the capacitance film and the protective film respectively are formed in this insulating film. Thereafter the openings (openings for contact) exposing the lower electrode and the upper electrode are formed in the capacitance film and the protective film respectively by etching the capacitance film and the protective film through the insulating film as a mask.

The openings can be reliably formed in the capacitance film and the protective film respectively without etching the upper electrode, by determining the material of the protective film and the thickness of the portion of the capacitance film to be provided with the opening so that the opening is formed in the capacitance film before formation of the opening in the protective film and setting the time for etching the capacitance film and the protective film to that necessary and sufficient for forming the opening in the protective film.

The protective film is laminated on the upper electrode, whereby the upper electrode can be prevented from being etched when the through-holes are formed in the insulating film.

The foregoing and other objects, features and effects of the present invention will become apparent from the following description of the embodiments given with reference to the appended drawings.

DETAILED DESCRIPTION OF PREFERRED EMBODIMENTS

Embodiments of the present invention are now described in detail with reference to the accompanying drawings.

Figure 1:
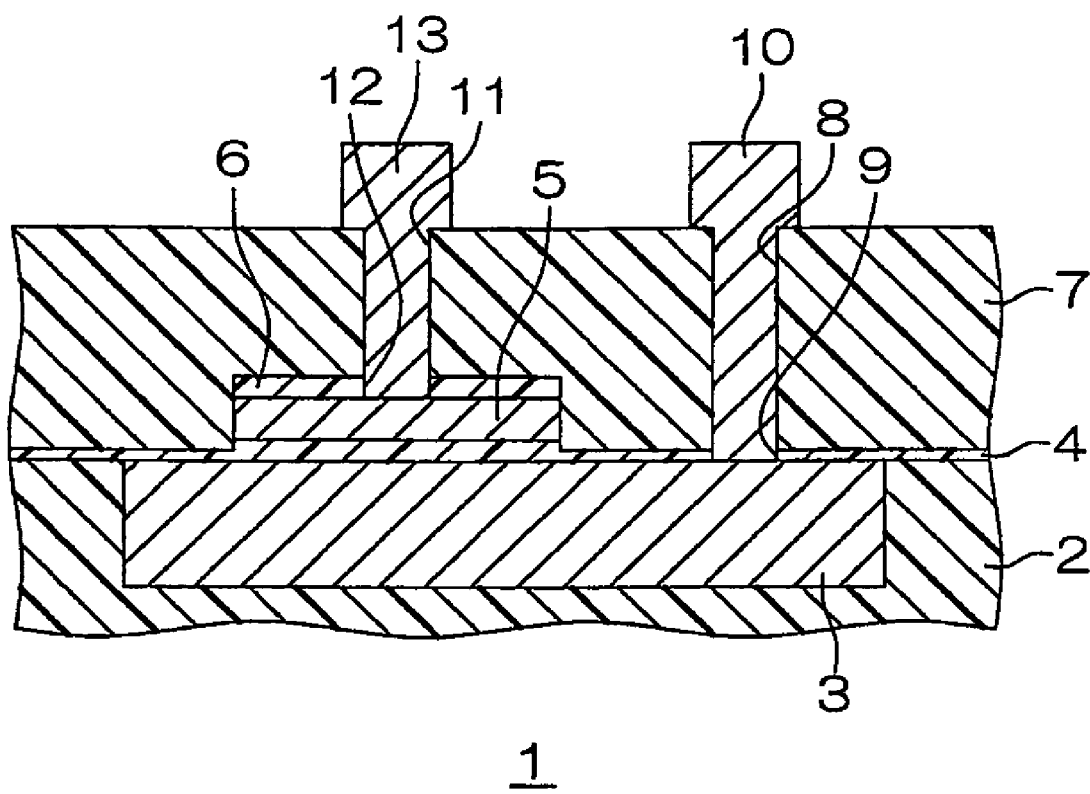
FIG. 1 is a sectional view schematically showing the structure of a semiconductor device according to an embodiment of the present invention.

FIG. 1 is a sectional view schematically showing the structure of a semiconductor device according to an embodiment of the present invention.

This semiconductor device 1 includes an interlayer insulating film 2 made of $SiO_2$ (silicon oxide) on a semiconductor substrate (not shown) provided with a functional element such as MOSFET (metal oxide semiconductor field effect transistor). A Low-k film material such as SiOC (carbon-doped silicon oxide) or SiOF (fluorine-doped silicon oxide) may alternatively be employed as the material of the interlayer insulating film 2.

A lower electrode 3 made of Cu is embedded in the surface layer portion of the interlayer insulating film 2. The surface of the lower electrode 3 is generally flush with the surface of the interlayer insulating film 2.

A capacitance film 4 made of SiN is laminated on the interlayer insulating film 2 and the lower electrode 3. In this capacitance film 4, a portion opposed to a portion of the lower electrode 3 has a thickness relatively larger than that of the remaining portion. For example, the portion of the capacitance film 4 opposed to the portion of the lower electrode 3 has a thickness of 35 to 40 nm, and the remaining portion has a thickness smaller than 35 nm.

On the portion of the capacitance film 4 having the relatively large thickness, an upper electrode 5 having the same outline as that of this portion in plan view is formed. Thus, the semiconductor device 1 includes a capacitance element of an MIM structure formed by the capacitance film 4 and the lower and upper electrodes 3 and 5 sandwiching the same therebetween. The upper electrode 5 is made of TiN. The thickness of the upper electrode 5 is set to 50 to 80 nm, for example.

A protective film 6 made of SiN, i.e., the same material as that of the capacitance film 4, is laminated on the upper electrode 5. This protective film 6 has the same outline as that of the upper electrode 5 in plan view. The protective film 6 is thicker than the portion of the capacitance film 4 having the relatively small thickness. According to this embodiment, the thickness of the protective film 6 is set to 35 to 40 nm.

Another interlayer insulating film 7 made of $SiO_2$ is formed on the capacitance film 4 and the protective film 6. This interlayer insulating film 7 covers the capacitance film 4, the upper electrode 5 and the protective film 6. A Low-k film material such as SiOC or SiOF may be employed as the material of the interlayer insulating film 7, similarly to the material of the interlayer insulating film 2.

In the interlayer insulating film 7, a lower electrode contact hole 8 is formed in a portion (not opposed to the protective film 6 in the thickness direction) adjacent to the capacitance film 4 in the thickness direction so as to pierce as a through-hole along the thickness direction. Further, an opening 9 communicating with the lower electrode contact hole 8 is formed in the capacitance film 4. Thus, the lower electrode 3 is partially exposed from the protective film 6 and the interlayer insulating film 7 through the lower electrode contact hole 8 and the opening 9. A lower electrode contact plug 10 made of a metallic material such as W (tungsten) or Cu is connected to the partially exposed portion of the lower electrode 3 through the lower electrode contact hole 8 and the opening 9.

In the interlayer insulating film 7, further, an upper electrode contact hole 11 is formed in a portion adjacent to the protective film 6 in the thickness direction so as to pierce as a through-hole along the thickness direction. Further, an opening 12 communicating with the upper electrode contact hole 11 is formed in the protective film 6. Thus, the upper electrode 5 is partially exposed from the protective film 6 and the interlayer insulating film 7 through the upper electrode contact hole 11 and the opening 12. An upper electrode contact plug 13 made of a metallic material such as W or Cu is connected to the partially exposed portion of the upper electrode 5 through the upper electrode contact hole 11 and the opening 12.

FIGS. 2(a) to 2(e) are schematic sectional views successively showing the steps of manufacturing process of the semiconductor device 1.

Figure 2A:
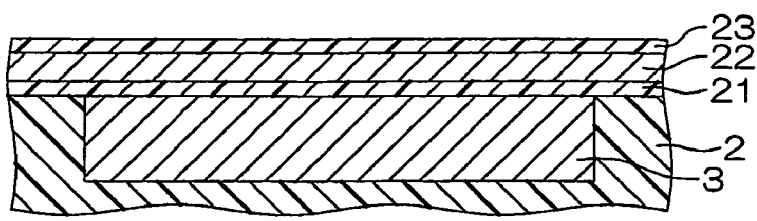
FIG. 2(a) is a schematic sectional view for illustrating a step of manufacturing process of the semiconductor device shown in FIG. 1.

First, a semiconductor substrate having the interlayer insulating film 2 on the outermost layer is prepared. Then, the lower electrode 3 embedded in the surface layer portion of the interlayer insulating film 2 is formed by the damascene process. Thereafter a capacitance film material deposition layer 21 made of the material for the capacitance film 4, a metallic material deposition layer 22 made of the material for the upper electrode 5 and a protective film material deposition layer 23 made of the material for the protective film 6 are laminated on the interlayer insulating film 2 in this order, as shown in FIG. 2(a). The capacitance film material deposition layer 21 and the protective film material deposition layer 23 can be formed by plasma CVD (chemical vapor deposition), for example. The metallic material deposition layer 22 can be formed by sputtering, for example.

Figure 2B:
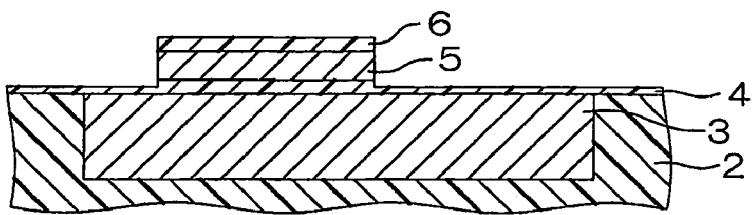
FIG. 2(b) is a schematic sectional view for illustrating the step subsequent to the step shown in FIG. 2(a).

Then, a resist pattern (not shown) having a shape corresponding to the upper electrode 5 and the protective film 6 is formed on the protective film material deposition layer 23. The protective film material deposition layer 23 and the metallic material deposition layer 22 are etched through the resist pattern as a mask. Thus, the upper electrode 5 and the protective film 6 are formed as shown in FIG. 2(b). A portion of the capacitance film material deposition layer 21 exposed from the resist pattern is slightly etched, whereby the capacitance film 4 is formed. After termination of this etching, the resist pattern is removed from the protective film 6.

Figure 2C:
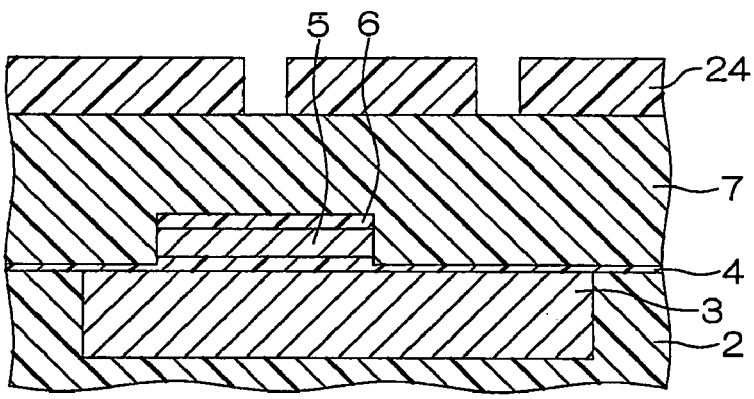
FIG. 2(c) is a schematic sectional view for illustrating the step subsequent to the step shown in FIG. 2(b).

Thereafter the interlayer insulating film 7 is formed on the capacitance film 4 and the protective film 6, as shown in FIG. 2(c). The interlayer insulating film 7 can be formed by sputtering, for example. Then, a resist pattern 24 having openings corresponding to the lower electrode contact hole 8 and the upper electrode contact hole 11 respectively is formed on the interlayer insulating film 7.

Figure 2D:
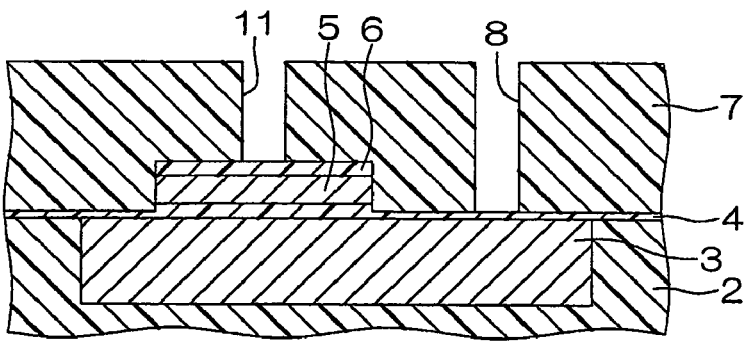
FIG. 2(d) is a schematic sectional view for illustrating the step subsequent to the step shown in FIG. 2(c).

Then, the interlayer insulating film 7 is etched through the resist pattern 24 as a mask. Thus, the lower electrode contact hole 8 and the upper electrode contact hole 11 are formed through the interlayer insulating film 7, as shown in FIG. 2(d).

Figure 2E:
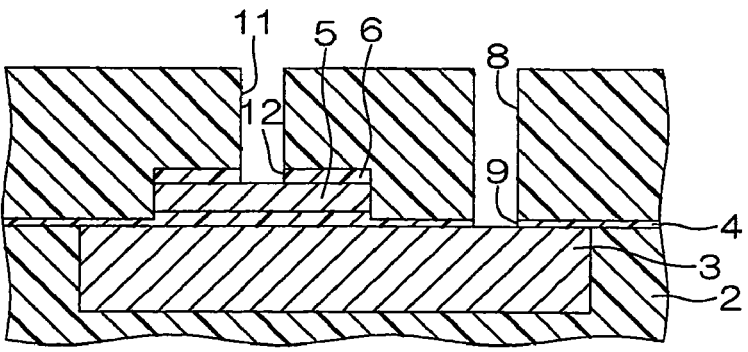
FIG. 2(e) is a schematic sectional view for illustrating the step subsequent to the step shown in FIG. 2(d).
Figure 3A:
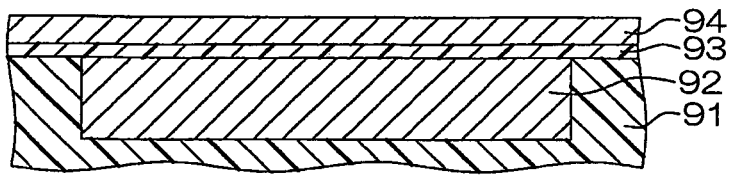
FIG. 3(a) is a schematic sectional view for illustrating a step of manufacturing process of a conventional semiconductor device.
Figure 3B:
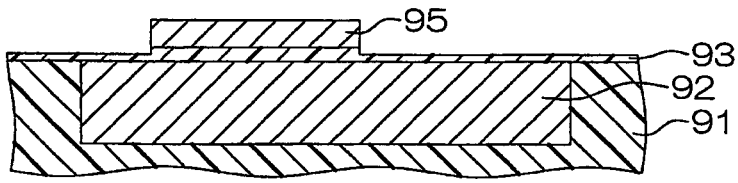
FIG. 3(b) is a schematic sectional view for illustrating the step subsequent to the step shown in FIG. 3(a).
Figure 3C:
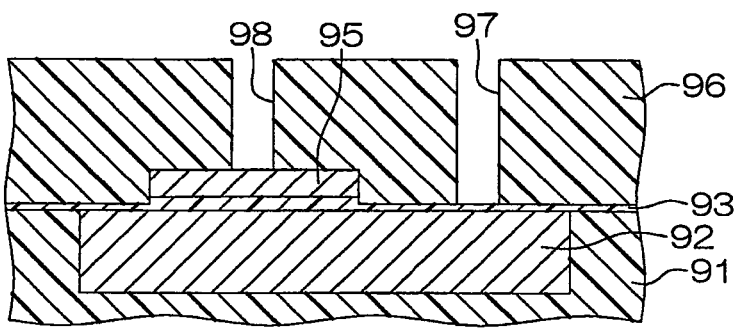
FIG. 3(c) is a schematic sectional view for illustrating the step subsequent to the step shown in FIG. 3(b).
Figure 3D:
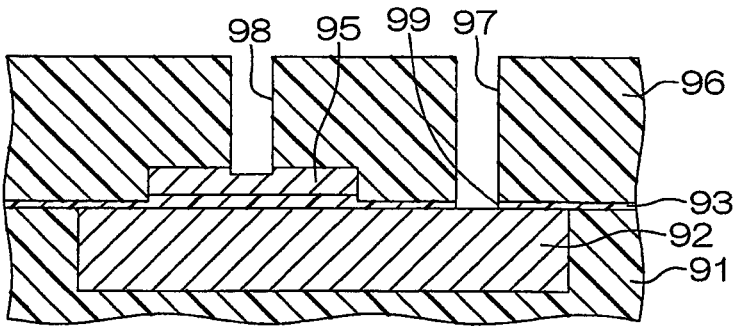
FIG. 3(d) is a schematic sectional view for illustrating the step subsequent to the step shown in FIG. 3(c).
Figure 3E:
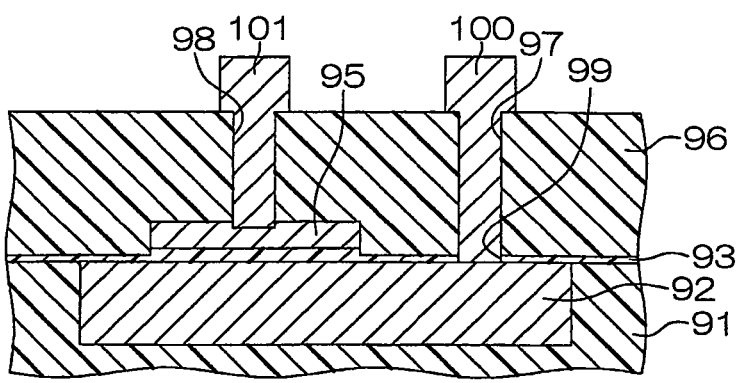
FIG. 3(e) is a schematic sectional view for illustrating the step subsequent to the step shown in FIG. 3(d).

Thereafter the capacitance film 4 and the protective film 6 are etched through the interlayer insulating film 7 as a mask, whereby the openings 9 and 12 are formed in the capacitance film 4 and the protective film 6 respectively, as shown in FIG. 2(e). The time for etching the capacitance film 4 and the protective film 6 is set to that necessary and sufficient for forming the opening 12 in the protective film 6.

Thereafter the lower electrode contact plug 10 and the upper electrode contact plug 13 are formed. Thus, the semiconductor device 1 having the structure shown in FIG. 1 is obtained.

In the semiconductor device 1, as hereinabove described, the capacitance film 4 is laminated on the lower electrode 3, and the upper electrode 5 is opposed to the portion of the lower electrode 3 with the capacitance film 4 sandwiched therebetween. The protective film 6 having the same outline as that of the upper electrode 5 in plan view is laminated on the upper electrode 5 with the same material as that of the capacitance film 4. Further, the interlayer insulating film 7 is laminated on the capacitance film 4 and the protective film 6. The lower electrode contact hole 8 and the opening 9 are formed in the interlayer insulating film 7 and the capacitance film 4 respectively, and communicate with each other. Further, the upper electrode contact hole 11 and the opening 12 are formed in the interlayer insulating film 7 and the protective film 6 respectively, and communicate with each other.

The openings 9 and 12 are formed by etching the capacitance film 4 and the protective film 6 respectively through the interlayer insulating film 7 as a mask having the lower electrode contact hole 8 and the upper electrode contact hole 11. The capacitance film 4 and the protective film 6 are made of the same material and the portion (portion having the relatively small thickness) of the capacitance film 4 to be provided with the opening 9 is smaller in thickness than the portion of the protective film 6 to be provided with the opening 12, whereby the openings 9 and 12 can be reliably formed in the capacitance film 4 and the protective film 6 respectively without etching the upper electrode 5, by setting the time for etching the capacitance film 4 and the protective film 6 to that necessary and sufficient for forming the opening 12 in the protective film 6.

The protective film 6 is laminated on the upper electrode 5, whereby the upper electrode 5 can be prevented from being etched when the lower electrode contact hole 8 and the upper electrode contact hole 11 are formed in the interlayer insulating film 7.

While the protective film 6 is made of the same material as that of the capacitance film 4 according to this embodiment, the material of the protective film 6 may alternatively be different from that of the capacitance film 4, as long as the same is an insulating material. For example, SiN and $SiO_2$ may be employed as the materials of the capacitance film 4 and the protective film 6 respectively. When the materials of the capacitance film 4 and the protective film 6 are different from each other, the openings 9 and 12 can be reliably formed in the capacitance film 4 and the protective film 6 respectively without etching the upper electrode 5, by determining the material of the protective film 6 and the thickness of the portion of the capacitance film 4 to be provided with the opening 9 so that the opening 9 is formed in the capacitance film 4 before formation of the opening 12 in the protective film 6 and setting the time for etching the capacitance film 4 and the protective film 6 to that necessary and sufficient for forming the opening 12 in the protective film 6.

While the lower electrode 3 is made of Cu in this embodiment, Al may alternatively be employed as the material of the lower electrode 3. When Al is employed as the material of the lower electrode 3, $SiO_2$ can be employed as the material of the capacitance film 4. Further, SiC (silicon carbide), SiOC, SiCN (silicon carbonitride) or $Ta_2O_5$ can be employed as the material of the capacitance film 4 in place of SiN, regardless whether the lower electrode 3 is made of Cu or Al.

While the upper electrode 5 is made of TiN in this embodiment, Al, an Al alloy, Ti (titanium), a Ti compound, Ta (tantalum) or a Ta compound can alternatively be employed as the material of the upper electrode 5.

Although the embodiments of the present invention have been described and illustrated in detail, it is clearly understood that the same are only by way of illustration and example for showing the technical contents of the present invention and are not to be taken by way of limitation. The spirit and scope of the present invention are limited only by the terms of the appended claims.

What is claimed is:

1. A semiconductor device comprising:
    an interlayer insulating film on a semiconductor substrate;
    a trench formed in a surface layer portion of said interlayer insulating film;
    a lower electrode embedded in said trench;
    a capacitance film laminated directly on said interlayer insulating film and said lower electrode;
    an upper electrode formed on said capacitance film and having an outline smaller than that of said lower electrode in plan view; and
    a protective film formed on said upper electrode;
    wherein said capacitance film is relatively thick at a portion under said upper electrode and relatively thin at a portion of outside of said upper electrode in plan view, and
    said protective film is thicker than a thickness of said relatively thin portion of said capacitance film.

2. The semiconductor device according to claim 1, wherein said capacitance film and said protective film are made of the same material.

3. The semiconductor device according to claim 1, wherein thicknesses of said protective film and said relatively thick portion of said capacitance film are substantially the same.

4. The semiconductor device according to claim 1, wherein said protective film and said upper electrode have substantially the same outline in plan view.

5. The semiconductor device according to claim 1, wherein a thickness of said relatively thick portion of said capacitance film is set to 35 to 40 nm.

6. The semiconductor device according to claim 3, wherein thicknesses of said protective film and said relatively thick portion of said capacitance film are set to 35 to 40 nm.

7. The semiconductor device according to claim 1, wherein said lower electrode is made of Cu (copper).

8. The semiconductor device according to claim 1, wherein said interlayer insulating film is made of a low-k film material.

9. The semiconductor device according to claim 1, wherein said upper electrode is made of TiN (titanium nitride).

* * * * *